United States Patent
Lee

(10) Patent No.: US 9,042,189 B2
(45) Date of Patent: May 26, 2015

(54) SEMICONDUCTOR MEMORY DEVICE

(75) Inventor: Yin Jae Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 683 days.

(21) Appl. No.: 13/357,133

(22) Filed: Jan. 24, 2012

(65) Prior Publication Data

US 2012/0195143 A1 Aug. 2, 2012

(30) Foreign Application Priority Data

Jan. 28, 2011 (KR) ........................ 10-2011-0008844

(51) Int. Cl.
*G11C 7/10* (2006.01)
*G11C 7/22* (2006.01)

(52) U.S. Cl.
CPC .............. *G11C 7/1027* (2013.01); *G11C 7/109* (2013.01); *G11C 7/222* (2013.01)

(58) Field of Classification Search
USPC ......... 365/201, 230.1, 230.06, 233.1, 233.18, 365/194, 189.011
See application file for complete search history.

(56) References Cited

U.S. PATENT DOCUMENTS

| | | | |
|---|---|---|---|
| 6,279,116 B1* | 8/2001 | Lee | 713/601 |
| 6,356,507 B1* | 3/2002 | Kaku et al. | 365/233.1 |
| 2003/0026138 A1* | 2/2003 | Lee et al. | 365/194 |
| 2003/0053362 A1* | 3/2003 | Kawaguchi et al. | 365/222 |

FOREIGN PATENT DOCUMENTS

| | | |
|---|---|---|
| KR | 1020050079539 A | 10/2005 |
| KR | 10-0607161 B1 | 8/2006 |
| KR | 1020100128635 A | 12/2010 |
| KR | 1020110001417 A | 1/2011 |

* cited by examiner

*Primary Examiner* — Son Dinh
*Assistant Examiner* — Uyen B Tran
(74) *Attorney, Agent, or Firm* — William Park & Associates Ltd.

(57) ABSTRACT

A semiconductor memory device includes: a burst start signal generation unit configured to generate a first burst start signal by delaying a write pulse by a first period, generate a second burst start signal by delaying the write pulse by a second period, and selectively transmit the first or second burst start signal as a select burst start signal in response to a test signal; an input control signal generation unit configured to generate an input control signal in response to the first burst start signal; and a write command generation unit configured to generate a write driver enable signal in response to the select burst start signal.

8 Claims, 5 Drawing Sheets

US 9,042,189 B2

SEMICONDUCTOR MEMORY DEVICE

CROSS-REFERENCES TO RELATED APPLICATIONS

The present application claims priority under 35 U.S.C 119(a) to Korean Application No. 10-2011-0008844, filed on Jan. 28, 2011 in the Korean intellectual property Office, which is incorporated herein by reference in its entirety.

BACKGROUND

In general, a write operation of a semiconductor memory device refers to an operation of finally storing data, inputted from a data pad, in a memory cell through a global line and a local line. Here, the data inputted from the data pad is driven by a global line driver and transmitted to the global line, and the data inputted through the global line is driven by a write driver and transmitted to the local line.

FIG. 1 is a timing diagram explaining a write operation of a known semiconductor memory device.

When an external write command ECASP_WT is inputted at a time point T1, a write pulse WTP is generated at a time point T2 where one cycle of a first internal clock signal FCLKB passes. After a burst start signal LCWT generated by clock-shifting the write pulse WTP is enabled, an input control signal DINSTB is enabled. Here, the input control signal DINSTB is a signal for enabling a global line driver. After the input control signal DINSTB is enabled to a logic high level, the global line driver transmits data DATA inputted from a data pad to a global line.

Furthermore, at a time point T3, a write driver enable signal BWEN is generated after the burst start signal LCWT is enabled. Here, the write driver enable signal BWEN is a signal for enabling a write driver. When the write driver enable signal BWEN is enabled to a logic high level, the write driver transmits the data DATA inputted through the global line to a local line.

However, when the global line has a large loading level, the data DATA is delayed by a period A. Therefore, since the write driver cannot transmit the data DATA to the local line at a time point where the write driver enable signal BWEN is enabled, a write fail occurs.

SUMMARY

An embodiment of the present invention relates to a semiconductor memory device capable of substantially preventing a write fail by controlling an enable time point of a write driver enable signal in response to a test signal.

In one embodiment, a semiconductor memory device includes: a burst start signal generation unit configured to generate a first burst start signal by delaying a write pulse by a first period, generate a second burst start signal by delaying the write pulse by a second period, and selectively transmit the first or second burst start signal as a select burst start signal in response to a test signal; an input control signal generation unit configured to generate an input control signal in response to the first burst start signal; and a write command generation unit configured to generate a write driver enable signal in response to the select burst start signal.

In another embodiment, a semiconductor memory device includes: a command decoder configured to generate first and second burst start signals by delaying a write pulse by first and second periods and generate a column active pulse and a burst period pulse in response to a column control signal and a select burst start signal transmitted by selecting any one of the first and second burst start signals; an input control signal generation unit configured to generate an input control signal in response to the first burst start signal; and a write driver enable signal generation unit configured to generate a write driver enable signal in response to the column active pulse and the burst period pulse.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
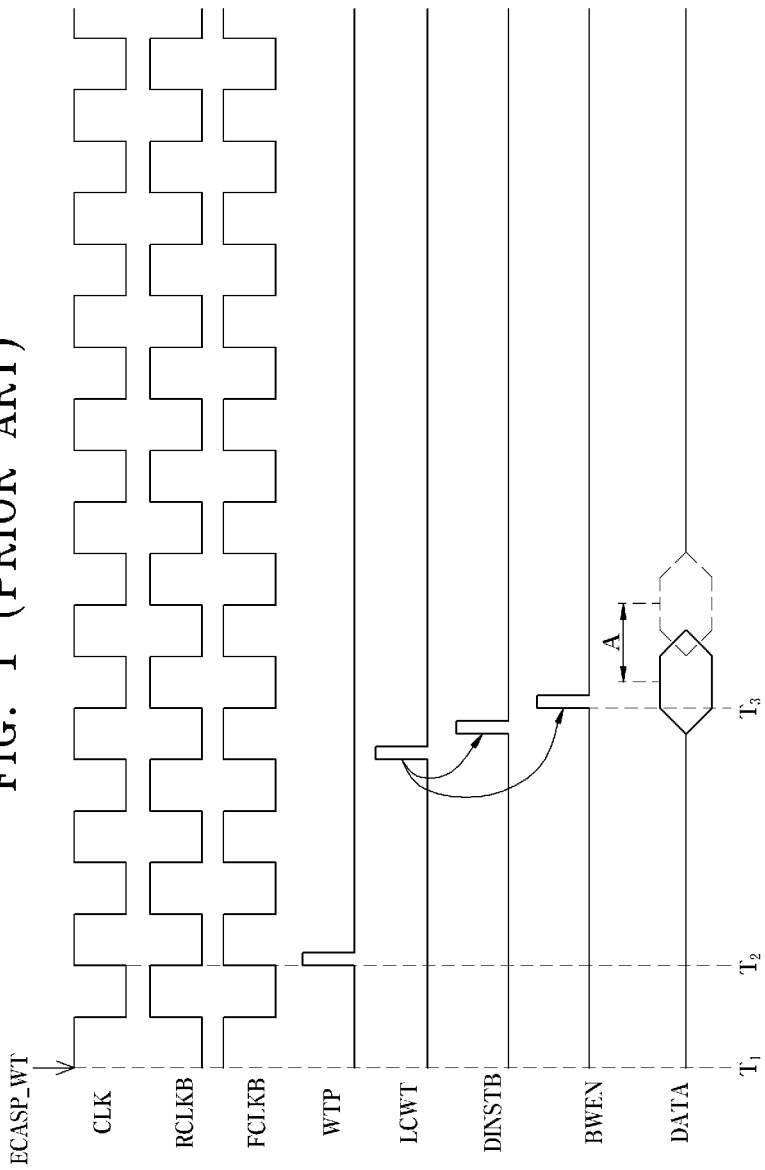
FIG. 1 is a timing diagram explaining a write operation of a known semiconductor memory device.
Figure 2:
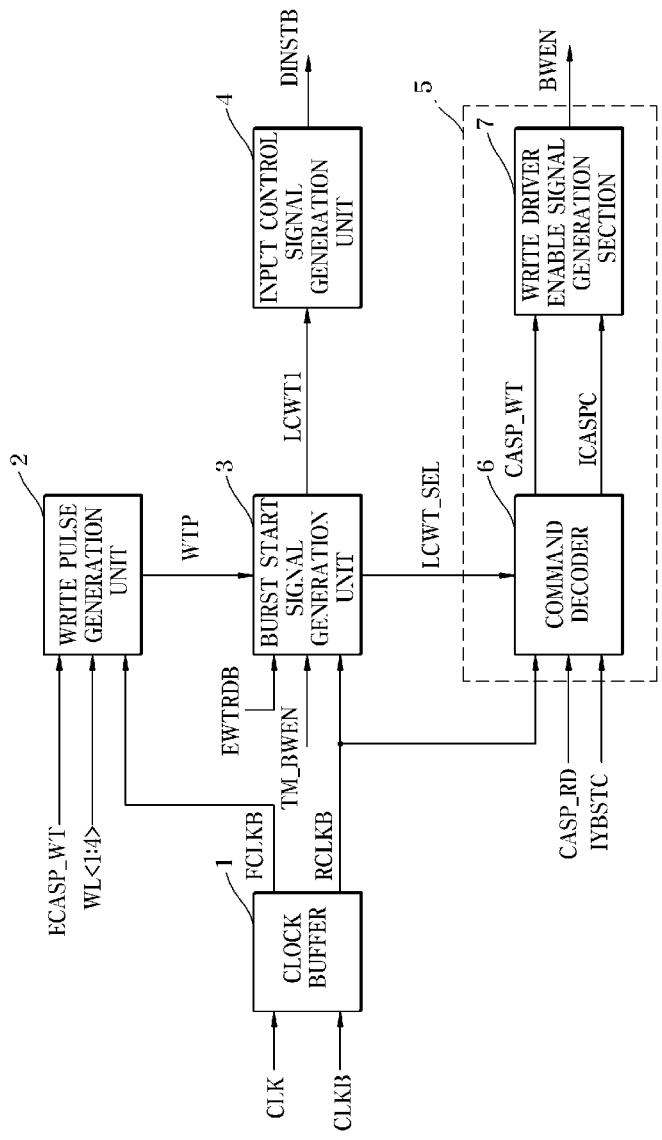
FIG. 2 is a block diagram of a semiconductor memory device in accordance with an embodiment of the present invention.

FIG. 2 is a block diagram of a semiconductor memory device in accordance with an embodiment of the present invention.

Referring to FIG. 2, the semiconductor memory device in accordance with an embodiment of the present invention includes a clock buffer 1, a write pulse generation unit 2, a burst start signal generation unit 3, an input control signal generation unit 4, and a write command generation unit 5. Here, the write command generation unit 5 may include a command decoder 6 and a write driver enable signal generation section 7.

The clock buffer 1 is configured to receive clock signals CLK and CLKB inputted from outside and generate a first internal clock signal FCLKB and a second internal clock signal RCLKB. The write pulse generation unit 2 is configured to receive an external write command ECASP_WT and a write latency signal WL<1:4> and generate a write pulse WTP. The burst start signal generation unit 3 is configured to generate a first burst start signal LCWT1 by delaying the write pulse WTP by a first period and generate a second burst start signal LCWT2 (not shown in FIG. 2) by delaying the write pulse WTP by a second period longer than the first period. For example, the burst start signal generation unit 3 is configured to generate the first burst start signal LCWT1 by delaying the write pulse WTP by two cycles of the second internal clock signal RCLKB and generate the second burst start signal LCWT2 by delaying the write pulse WTP by three cycles of the second internal clock signal RCLKB. Furthermore, the burst start signal generation unit 3 transmits the first burst start signal LCWT1 as a select burst start signal LCWT_SEL when a test signal TM_BWEN is at a logic low level, and transmits the second burst start signal LCWT2 as the select burst start signal LCWT_SEL when the test signal TM_BWEN is at a logic high level. Here, the test signal TM_BWEN is set to a logic low level when a loading level of a global line is smaller than a preset loading level of the global line. The input control signal generation unit 4 is configured to generate an input control signal DINSTB when the first burst start signal LCWT1 is enabled. The command decoder 6 is configured to receive the second internal clock signal RCLKB and output an inverted signal of the second internal clock signal RCLKB as a column active pulse CASP_WT, in a period where the select burst start signal LCWT_SEL is at a logic high level during a write operation. Furthermore, the command decoder 6 outputs an inverted signal of the second internal clock signal RCLKB and outputs the buffered signal as a burst period pulse ICASPC, in a period where the select burst start signal LCWT_SEL is at a logic low level and a column control signal IYBSTC is at a logic high level during the write operation. The write driver enable signal generation section 7 is configured to receive the column active pulse CASP_WT and the burst period pulse ICASPC and generate a write driver enable signal BWEN.

The clock buffer 1 receives the clock signals CLK and CLKB inputted from outside and generates the first and second internal clock signals FCLKB and RCLKB. The first internal clock signal FCLKB is generated in synchronization with a falling edge of the clock signal CLK, and the second internal clock signal RCLKB is generated in synchronization with a rising edge of the clock signal CLK.

The write pulse generation unit 2 receives the external write command ECASP_WT and the write latency signal WL<1:4> and generates the write pulse WTP. When the write latency signal WL<1:4> is at a logic high level, write latency is set to 1. When the external write command ECASP_WT is inputted, the write pulse WTP is enabled to a logic high level after one period of the first internal clock signal FCLKB.

Figure 3:
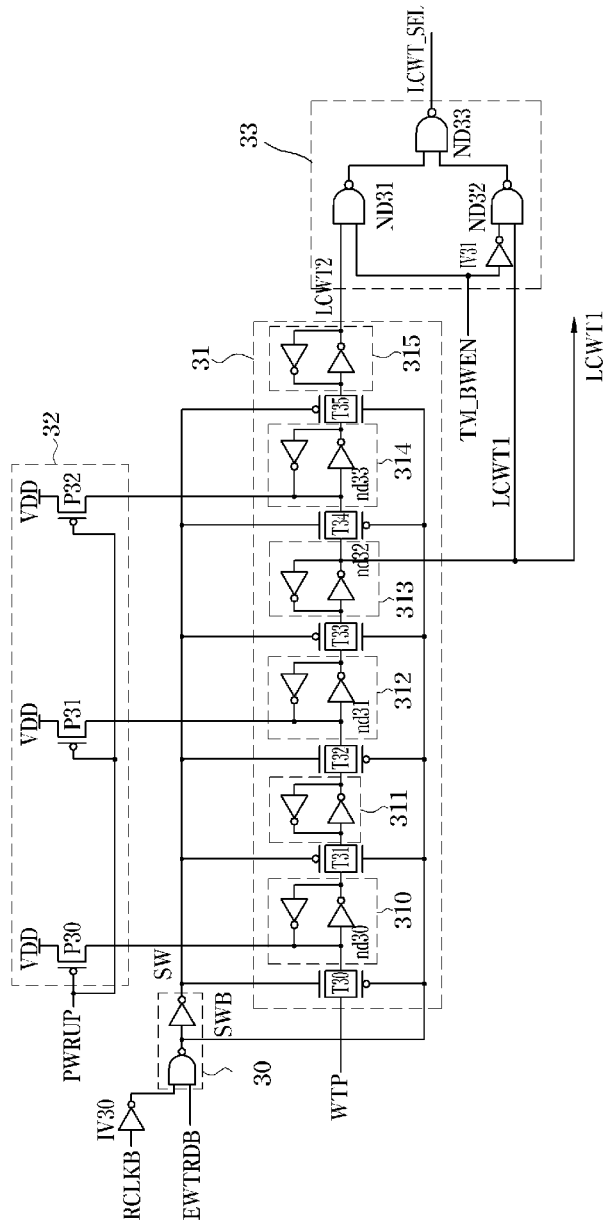
FIG. 3 is a circuit diagram of a burst start signal generation unit included in the semiconductor memory device of FIG. 2.

Referring to FIG. 3, the burst start signal generation unit 3 includes a switching signal generation section 30, a clock shifter 31, an initialization section 32, and a select output section 33.

The switching signal generation section 30 is configured to receive an inverted signal of the second internal clock signal RCLKB and a flag signal EWTRDB and generate a switching signal SW and an inverted switching signal SWB. Here, the flag signal EWTRDB maintains a logic low level during a read operation and a logic high level during a write operation. The switching signal generation section 30 configured in such a manner buffers the inverted signal of the second internal clock signal RCLKB and transmits the buffered signal as the switching signal SW and the inverted switching signal SWB, during a write operation.

The clock shifter 31 includes a plurality of transmission gates T30 to T35 which are selectively turned on in response to the switching signal SW and the inverted switching signal SWB, and a plurality of latches 310 to 315. The clock shifter 31 configured in such a manner generates the first burst start signal LCWT1 by delaying the write pulse WTP by two periods of the second internal clock signal RCLKB, and generates the second burst start signal LCWT2 by delaying the write pulse WTP by three periods of the second internal clock signal RCLKB.

The initialization section 32 includes a plurality of PMOS transistors P30 to P32 which are turned on in response to a power-up signal PWRUP, and is configured to initialize internal nodes nd30, nd31, and nd33 of the clock shifter 31 to a logic high level. The power-up signal PWRUP maintains a logic low level during a period (hereafter, referred to as 'power-up period') before an external voltage VDD increases to a preset level, and changes to a logic high level after the power-up period is terminated.

The select output section 33 includes three NAND gates ND31 to ND33 and one inverter IV31. The select output section 33 is configured to buffer the first burst start signal LCWT1 to transmit as the select burst start signal LCWT_SET when the test signal TM_BWEN is at a logic low level, and buffer the second burst start signal LCWT2 to transmit as the select burst start signal LCWT_SET when the test signal TM_BWEN is at a logic high level.

The burst start signal generation unit 3 configured in such a manner generates the first burst start signal LCWT1 by delaying the write pulse WTP by two cycles of the second internal clock signal RCLKB, and generates the second burst start signal LCWT2 by delaying the write pulse WTP by delaying the write pulse WTP by three cycles of the second internal clock signal RCLKB. Furthermore, the burst start signal generation unit 3 transmits the first burst start signal LCWT1 as the select burst start signal LCWT_SEL when the test signal TM_BWEN is at a logic low level, and transmits the second burst start signal LCWT2 as the select burst start signal LCWT_SEL when the test signal TM_BWEN is at a logic high level. Here, the test signal TM_BWEN is set to a logic low level when the loading level of the global line is smaller than the preset loading level of the global line.

The input control signal generation unit 4 generates the input control signal DINSTB when the first burst start signal LCWT1 is enabled.

The write command generation unit 5 may include the command decoder 6 and the write driver enable signal generation section 7.

Figure 4:
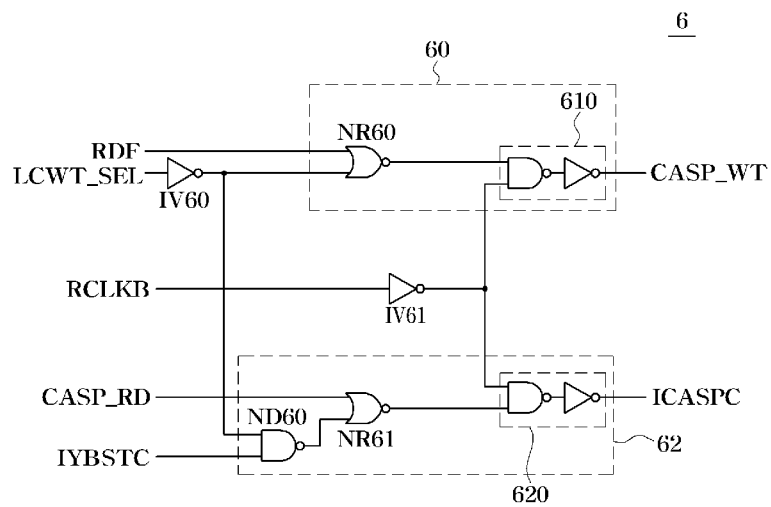
FIG. 4 is a circuit diagram of a command decoder included in the semiconductor memory device of FIG. 2.

Referring to FIG. 4, the command decoder 6 includes a first pulse generator 60 and a second pulse generator 62.

The first pulse generator 60 includes a NOR gate NR60 and a logic unit 610. The NOR gate NR60 is configured to receive a read flag signal RDF and an inverted signal of the select burst start signal LCWT_SEL and perform a NOR operation on the received signals. The logic unit 610 is configured to receive an inverted signal of the second internal clock signal RCLKB and an output signal of the NOR gate NR60 and perform an AND operation on the received signals. Here, the read flag signal RDF maintains a logic high level during a read operation and a logic low level during a write operation.

The first pulse generator 60 configured in such a manner buffers the inverted signal of the second internal clock signal RCLKB and outputs the buffered signal as the column active pulse CASP_WT, in a period where the select burst start signal LCWT_SEL is at a logic high level during a write operation.

The second pulse generator 62 includes a NAND gate ND60, a NOR gate NR61, and a logic unit 620. The NAND gate ND60 is configured to receive the inverted signal of the select burst start signal LCWT_SEL and the column control signal IYBSTC and perform a NAND operation on the received signals. The NOR gate NR61 is configured to receive a read column active pulse CASP_RD and an output signal of the NAND gate ND60 and perform a NOR gate on the received signals. The logic unit 620 is configured to receive the inverted signal of the second internal clock signal RCLKB and an output signal of the NOR gate NR61 and perform an AND operation on the received signals. Here, the read column active pulse CASP_RD becomes a logic high level when a read command for a read operation is inputted, and inputted at a logic low level when a write command for a write operation is inputted.

The second pulse generator 62 configured in such a manner buffers the inverted signal of the second internal clock signal RCLKB and outputs the buffered signal as the burst period pulse ICASPC in a period where the select burst start signal LCWT_SEL is at a logic low level and the column control signal IYBSTC is at a logic high level during a write operation. Here, the column control signal IYBSTC is a signal which is enabled to a logic high level from a period where a pulse of the column active pulse CASP_WT is inputted to a period where a burst is completed.

The write driver enable signal generation section 7 receives the column active pulse CASP_WT and the burst period pulse ICASPC, and generates the write driver enable signal BWEN when the select burst start signal LCWT_SEL is enabled.

Figure 5:
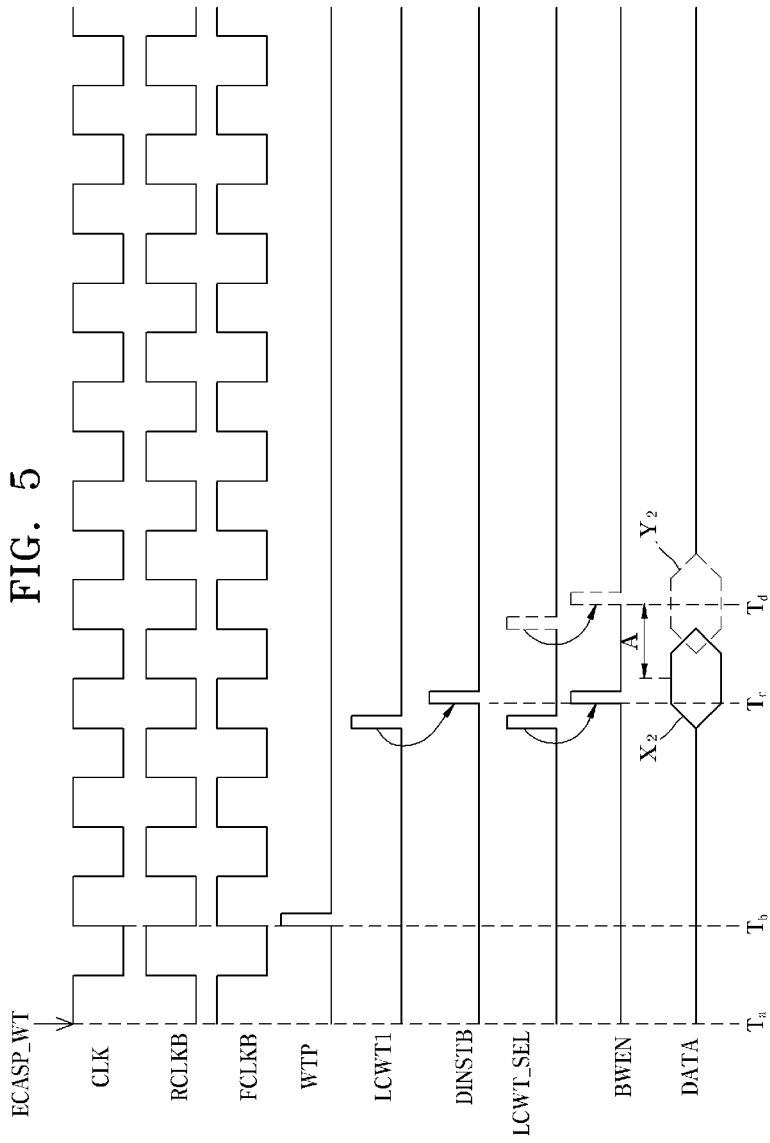
FIG. 5 is a timing diagram explaining the operation of the semiconductor memory device in accordance with an embodiment of the present invention.

The operation of the semiconductor memory device in accordance with an embodiment of the present invention will be described with reference to FIG. 5. The operation may be divided into a case in which the loading level of the global line is smaller than the preset loading level of the global line and a case in which the loading level of the global line is larger than the preset loading level of the global line.

First, the case in which the loading level of the global line is smaller than the preset loading level of the global line, that is, a case in which the test signal TM_BWEN is at a logic low level and data DATA is inputted to a write driver at a time point Tc(X2) will be described.

The external write command ECASP_WT is inputted at a time point Ta, and the write pulse WTP is generated at a time point Tb where one cycle of the first internal clock signal FCLKB passes. The first burst start signal LCWT1 is generated by delaying the write pulse WTP by two cycles of the second internal clock signal RCLKB. If the first burst start signal LCWT1 is enabled, the input control signal DINSTB is enabled. Here, referring to FIG. 3, since the test signal TM_BWEN is at a logic low level, the first burst start signal LCWT1 is transmitted as the select burst start signal LCWT_SEL. Therefore, the write driver enable signal BWEN is enabled at the time point Tc in response to the select burst start signal LCWT_SEL. Here, the select burst start signal LCWT_SEL is represented by a solid line in the FIG. 5. The write driver (not illustrated) transmits the data DATA inputted at the time point Tc to the local line.

Next, the case in which the loading level of the global line is larger than the preset loading level of the global line, that is, a case in which the test signal TM_BWEN is at a logic high level and the data DATA is inputted to the write driver at a time point Td where the data DATA is delayed by a period A (Y2) will be described as follows.

The external write command ECASP_WT is inputted at the time point Ta, and the write pulse WTP is generated at the time point Tb where one cycle of the first internal clock signal FCLKB passes. The first burst start signal LCWT1 is generated by delaying the write pulse WTP by two cycles of the second internal clock signal RCLKB. If the first burst start signal LCWT1 is enabled, the input control signal DINSTB is enabled. Here, referring to FIG. 3, since the test signal TM_BWEN is at a logic high level, the second burst start signal LCWT2 generated by delaying the write pulse WTP by three cycles of the second internal clock signal RCLKB is transmitted as the select burst start signal LCWT_SEL. Therefore, the write driver enable signal BWEN is enabled at a time point Td in response to the select burst start signal LCWT_SEL. Here, the select burst start signal LCWT_SEL is represented by a dotted line in the FIG. 5. The write driver (not illustrated) transmits the data DATA inputted at the time point Td to the local line.

As described above, the semiconductor memory device in accordance with an embodiment of the present invention controls the enable time point of the write driver enable signal in response to the test signal, thereby substantially reduce a write failure.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
   a burst start signal generation unit configured to generate a first burst start signal by delaying a write pulse by a first period, generate a second burst start signal by delaying the write pulse by a second period, and selectively transmit the first or second burst start signal as a select burst start signal in response to a test signal;
   an input control signal generation unit configured to generate an input control signal in response to the first burst start signal; and
   a write command generation unit configured to generate a write driver enable signal in response to the select burst start signal.

2. The semiconductor memory device of claim 1, wherein the test signal changes to a logic high level, when a loading level of a global line is larger than a preset loading level of the global line.

3. The semiconductor memory device of claim 1, wherein the burst start signal generation unit comprises:
   a switching signal generation section configured to buffer an internal clock signal and generate a switching signal in response to a flag signal;
   a clock shifter configured to delay the write pulse by the first and second periods in response to the switching signal; and
   a selection output section configured to selectively output any one of the first and second burst start signals as the select burst start signal in response to the test signal.

4. The semiconductor memory device of claim 1, wherein the first period is formed to be shorter by integer cycles of the internal clock signal than the second period.

5. The semiconductor memory device of claim 1, wherein the write command generation unit comprises:
   a command decoder configured to generate a column active pulse and a burst period pulse in response to the select burst start signal and a column control signal; and
   a write driver enable signal generation section configured to generate a write driver enable signal in response to the column active pulse and the burst period pulse.

6. The semiconductor memory device of claim 5, wherein the command decoder comprises:
   a first pulse generator configured to buffer the internal clock signal and generate the column active pulse in response to the select burst start signal; and
   a second pulse generator configured to buffer the internal clock signal and generate the burst period pulse in response to the column control signal and the select burst start signal.

7. The semiconductor memory device of claim 6, wherein the first pulse generator comprises:
   a logic element configured to receive a read flag signal and a signal obtained by buffering the select burst start signal and perform a logic operation on the received signals; and
   a logic unit configured to receive an output signal of the logic element and a signal obtained by buffering the internal clock signal, perform a logic operation on the received signals, and generate the column active pulse.

8. The semiconductor memory device of claim 6, wherein the second pulse generator comprises:

a first logic element configured to receive the column control signal and a signal obtained by buffering the select burst start signal and perform a logic operation on the received signals;
a second logic element configured to receive an output signal of the first logic element and a read column active pulse and perform a logic operation on the received signals; and
a logic unit configured to receive an output signal of the second logic element and a signal obtained by buffering the internal clock signal, perform a logic operation on the received signals, and generate the burst period pulse.

* * * * *